United States Patent [19]

Zwack

[11] Patent Number: 5,574,408
[45] Date of Patent: Nov. 12, 1996

[54] OSCILLATOR CIRCUIT HAVING A MEMORY THAT STORES THE CHARACTERISTIC INFORMATION OF THE INDIVIDUAL OSCILLATOR CRYSTAL

[75] Inventor: Eduard Zwack, Puchheim, Germany

[73] Assignee: Siemens Aktiengesellschaft, Munich, Germany

[21] Appl. No.: 435,268

[22] Filed: May 5, 1995

Related U.S. Application Data

[63] Continuation of Ser. No. 178,840, Jan. 7, 1994, abandoned.

[30] Foreign Application Priority Data

Jan. 29, 1993 [DE] Germany .......................... 43 02 542.0

[51] Int. Cl.⁶ .................................................. H03B 5/32
[52] U.S. Cl. ............................ 331/176; 331/66; 331/158
[58] Field of Search ..................................... 331/158, 176, 331/66, 116 R

[56] References Cited

U.S. PATENT DOCUMENTS

| | | | |
|---|---|---|---|
| 4,537,165 | 8/1985 | Dinger et al. | 331/66 X |
| 4,746,879 | 5/1988 | Ma et al. | 331/44 |
| 4,893,097 | 1/1990 | Zwack | 331/176 |
| 4,910,473 | 3/1990 | Niwa | 331/176 |
| 4,949,055 | 8/1990 | Leitl | 331/158 |
| 4,967,165 | 10/1990 | Lee et al. | 331/66 |
| 5,081,431 | 1/1992 | Kubo et al. | 331/158 |
| 5,170,136 | 12/1992 | Yamakawa et al. | 331/176 |
| 5,216,389 | 6/1993 | Carralero et al. | 331/18 |

FOREIGN PATENT DOCUMENTS

| | | | |
|---|---|---|---|
| 0283529 | 9/1988 | European Pat. Off. . | |
| 0310863 | 12/1989 | European Pat. Off. . | |
| 2469823 | 5/1981 | France . | |
| 0162478 | 9/1984 | Japan | 331/158 |
| 0035017 | 2/1988 | Japan | 331/158 |
| 0312704 | 12/1988 | Japan | 331/158 |
| 0470001 | 3/1992 | Japan | 331/158 |
| 1443120 | 12/1988 | U.S.S.R. | 331/158 |

*Primary Examiner*—Robert Pascal
*Assistant Examiner*—Arnold Kinkead
*Attorney, Agent, or Firm*—Hill, Steadman & Simpson

[57] ABSTRACT

In an oscillator circuit (VCOS) that contains an oscillator crystal having characteristic information (ki) individually associated to the oscillator crystal, the crystal signals or digital clock signals (ts) are conducted to an output (A). A memory that stores the individual characteristic information (ki) of the oscillator crystal is fashioned in the oscillator circuit (VCOS) such that the individual characteristic information (ki) of the oscillator crystals are moved to at least one output (A, AM) of the oscillator circuit (VCOS) as analog, digital, coded digital or modulated signals (msp).

27 Claims, 2 Drawing Sheets

OSCILLATOR CIRCUIT HAVING A MEMORY THAT STORES THE CHARACTERISTIC INFORMATION OF THE INDIVIDUAL OSCILLATOR CRYSTAL

This is a continuation of application Ser. No. 178,840, filed Jan. 7, 1994, now abandoned.

BACKGROUND OF THE INVENTION

Oscillator crystals are used in oscillator circuits in clock-controlled, telecommunications equipment because of their stability and reliability. Dependent on the crystal sections, the oscillator crystals have different temperature-dependent resonant frequencies. The temperature dependency is defined by a temperature characteristic or characteristic information individually associated to an oscillator crystal and is calculated or measured during the crystal manufacture. This temperature-related characteristic information and other individual characteristic information of the oscillator crystals, (for example, modification of the oscillator crystal properties due to aging of the oscillator crystal) are communicated to the users of oscillator crystals (particularly for oscillator circuits) on data sheets or are separately communicated in printed form for every crystal. Further, in the prior art legends are used on the oscillator crystals that reference the individual characteristic information of the oscillator crystals on data sheets. The oscillator crystals are preferably utilized in oscillator circuits wherein digital clock signals are formed having a frequency prescribed by the oscillator crystal. Due to the individual properties of the oscillator crystals, the individual characteristic information of the oscillator crystals must be available for high-precision clock controls in the clock devices (particularly in phase-locked loopcontrolled clock devices) that process the digital clock signals and that are connected to the oscillator circuit. Since clock control methods realized by programs are being increasingly provided in the clock means, the input of the individual characteristic information of the oscillator crystals in the oscillator circuit ensues separately for each clock control. This means a substantial added outlay in the allocation of an oscillator circuit to a clock means or to a means wherein a high-precision processing of the clock signals occurs and in which, consequently, the individual characteristic information of the oscillator crystals is to be introduced.

SUMMARY OF THE INVENTION

The present invention is therefore based on the object of reducing this substantial outlay for the introduction of the individual characteristic information of the oscillator crystals into the further-processing means that is connected to the respective oscillator circuit.

In general terms the present invention is an oscillator circuit having an oscillator crystal with characteristic information individually associated to the oscillator crystal. Oscillation signals formed in the oscillator circuit are connected to an output. The individual characteristic information of the oscillator crystal are stored in a memory that are fashioned in the oscillator circuit such that the individual characteristic information of the oscillator crystals are moved to at least one output of the oscillator circuit as analog, digital coded digital or modulated signals.

An important aspect of the oscillator circuit of the present invention is that a means that stores the individual information of the oscillator crystals is arranged therein and is fashioned such that the individual characteristic information of the oscillator crystals are moved to an output of the oscillator circuit as analog, digital, coded digital signals or as modulated signals. The individual information of the oscillator crystals are thereby preferably stored when the oscillator circuit is manufactured. An advantage of the oscillator circuit of the present invention is that, following a one-time storing of the individual characteristic information of the oscillator crystals, this characteristic information is always available to the further-processing means at an output of the oscillator circuit and therefore no longer need be introduced by involved input given the connection or change of a further-processing means.

In an especially advantageous manner, the means storing the individual characteristic information of the oscillator crystals given a formation of digital clock signals in the oscillator circuit is realized by a means for influencing the clock signals. The individual characteristic information of the oscillator crystals are thereby conducted to the already existing output of the clock signals together with the clock signals, whereby the clock signals are influenced dependent on the individual stored characteristic information of the oscillator crystals. This influencing is also possible for clock signals that are formed in a precision oscillator arranged in the oscillator circuit. The current temperature of the oscillator circuit is measured using the precision oscillator and the measured signals that are formed, preferably digital measured signals, are conducted via a measured output of the oscillator circuit to the further-processing means. Important properties of a temperature oscillator circuit are that temperature changes produce optimally high frequency changes of the measured signals that are formed.

The temperature characteristic of an oscillator crystal represents a critical, individual characteristic information of an oscillator crystal, whereby the temperature characteristics indicate the resonant frequencies of the respective oscillator crystal dependent on the ambient temperature. In order to limit the scope of individual characteristic information of the oscillator crystals, a group of temperature characteristics is allocated to an individual characteristic information of an oscillator crystal. The size of the allocated group of temperature characteristics is to be thereby matched to the required precision demanded of the frequency stability of the clock signals that are formed. This means that the number of temperature characteristics per group is to be reduced given stricter precision demands.

According to an advantageous development of the oscillator circuit, the means for influencinq clock signals or measured signals are realized by a modulation means that modulates the signal pulse, (pulse duration modulation or pulse spacing modulation) a duration or signal pulse pause, or by a frequencysetting means modifying the signal frequency in a prescribed fashion, or by a level means that varies the signal level, or by an impedance means that varies the impedance of the output of the oscillator circuit.

The pulse duration or pulse pause modulation of the clock signals or of the measured signals hereby represents an especially advantageous version of the present invention since a coded, arbitrarily extensive information is thereby formed by combining a plurality of clock signals or measured signals and can be communicated to a further-processing means. The influencing of the clock signals or measured signals is thereby realized by known modulation means, frequency-setting means, level means and impedance means.

The means for storing the individual characteristic information of the oscillator crystals or temperature characteristic information are advantageously realized by adjustable setting means that form digital information or by programmable memory means. The setting means, for example, are formed by switch elements or coding switch elements that are set in conformity with the currently measured temperature characteristic of the oscillator crystal during manufacture of an oscillator circuit, i.e. when a clock oscillator generating a clock signal is fabricated. Alternatively thereto, the temperature characteristic information can be stored in one-time fashion in a programmable memory of the oscillator circuit that is arranged in the oscillator circuit. This storage is to be changed only given a change of the oscillator crystal in the respective oscillator circuit.

For a weighting or evaluation of the modified or influenced clock or measured signals, a means for recognizing and weighting the modified or influenced clock or measured signal is arranged in a further-processing means connected to the output or to the measured output of the oscillator circuit. It is fashioned such that the individual information of the oscillator crystal can be derived from the supplied, modified or influenced clock or measured signal. Analogous to the means for the influencing the clock signals or measured signals, the means for recognizing and weighting the modified clock signals in the further-processing means are realized by: a demodulation means that demodulates the pulse duration modulated or the pulse pause modulated clock or measured signals; a frequency-measuring means that recognizes the clock signal frequency or measured signal frequency modified in prescribed form; or a level-measuring means or impedance-measuring means that measures the level of the clock signals or of the measured signals or the impedance of the output or measured output of the oscillator circuit. A demodulation means that demodulates the pulse duration or pulse pause modulated clock or measured signals can be particularly advantageously realized in microprocessor-controlled means that further-processes the digital signals, since only two information statuses need be allocated to each clock signal given a pulse telegram formed by a plurality of clock signals or measured signals and, thus, are matched to a digital information processing or further-processing.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
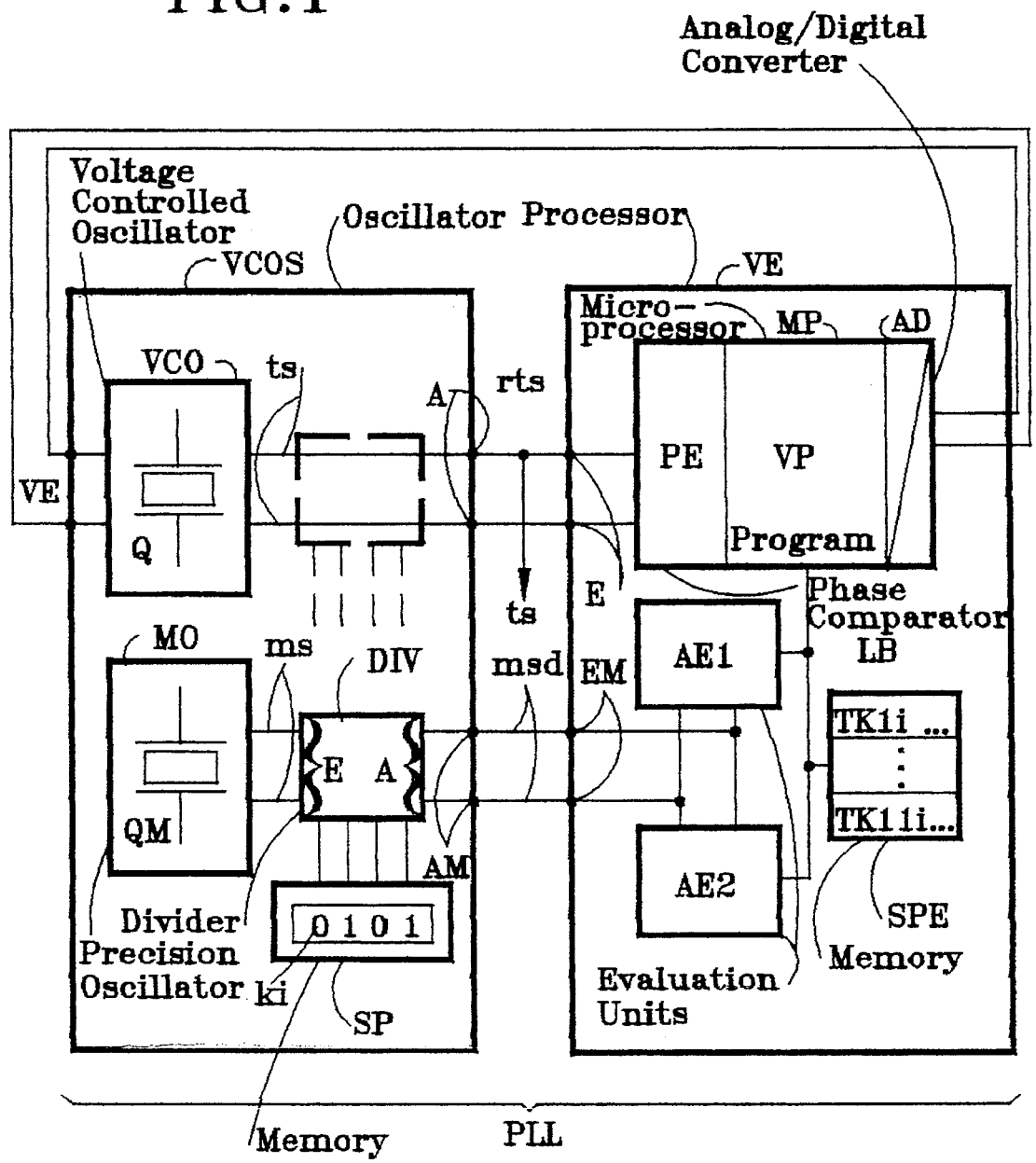
FIG. 1 is a block circuit diagram of the phase-locked loop of the present invention.

FIG. 1 shows a phase-locked loop PLL that is formed by a voltage-controlled oscillator circuit VCOS and by a processing means VE. The function of a phase-locked loop PLL is for phasesynchronously regulating the clock signal to formed in the voltagecontrolled oscillator circuit VCOS relative to the reference clock signals rts supplied to the phase-locked loop PLL. The phaselocked loop PLL, for example, is arranged in the central clock means of a communication system, whereby the clock signals ts are to be controlled synchronously relative to incoming reference clock signals rts of a higher-ranking clock means.

Let it be assumed for the exemplary embodiment that the voltage-controlled oscillator circuit VCOS has a voltage-controlled oscillator VCO that forms the clock signals ts and has a precision oscillator MO that forms measured signals ms. The clock signal frequency of the clock signals ts is defined by an oscillator crystal Q. Let it be assumed for the exemplary embodiment that an oscillator crystal Q having "AT section" utilized. Such oscillator crystals Q usually have one of the temperature characteristics TK shown in FIG. 2. The temperature characteristics TK are shown in an X,Y coordinate system, whereby the temperature changes T of the oscillator crystal Q are entered in degrees Celsius on the X-axis and the resonant frequency deviations from the nominal resonant frequency F of the oscillator crystal are entered on the Y-axis.

Figure 2:
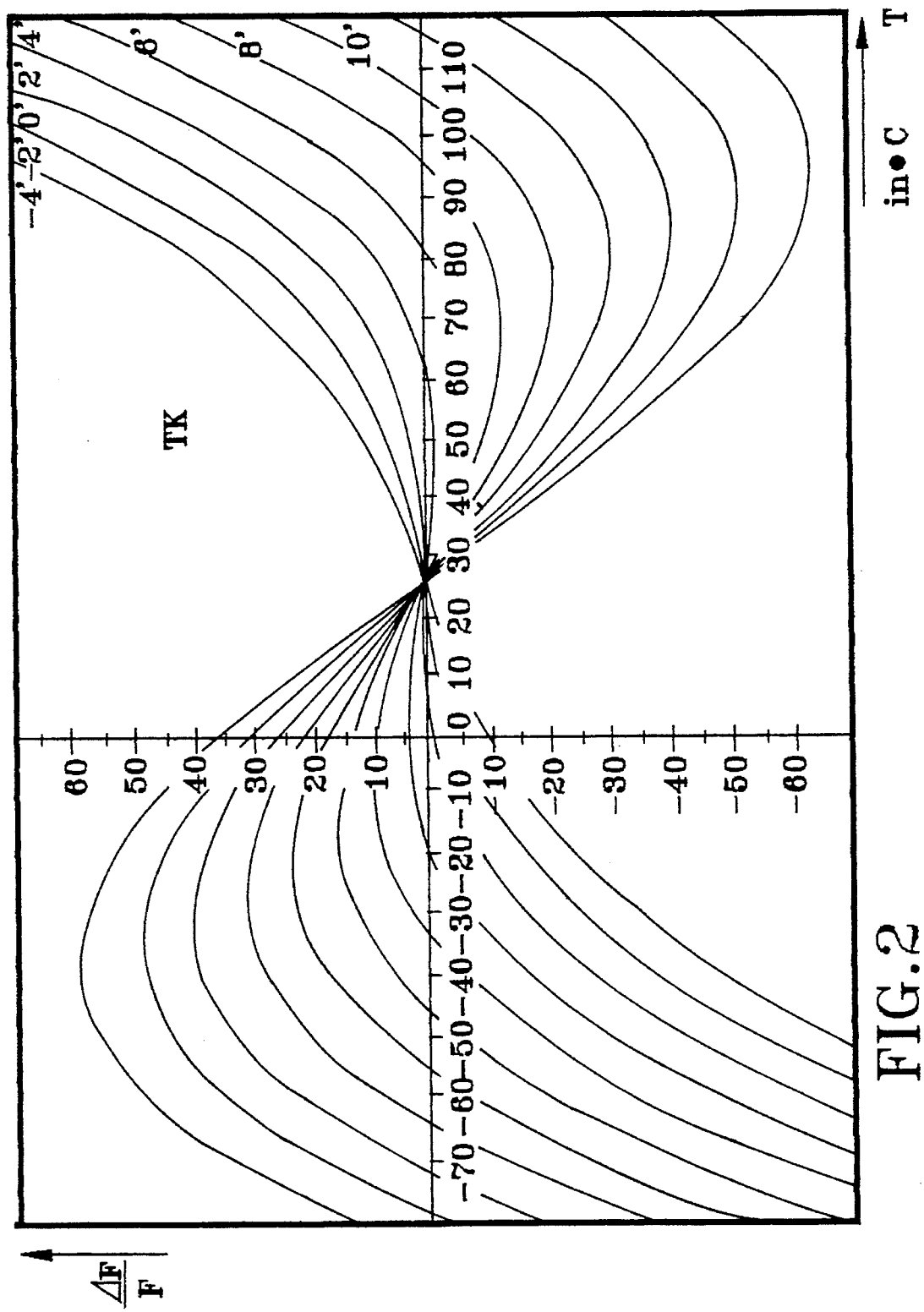
FIG. 2 is a diagram wherein temperature characteristics of crystals having "AT section" are shown.

In FIG. 2, each illustrated temperature characteristic TK represents a group of temperature characteristics TK that each respectively covers an ambient temperature range of +/−1° C. The number of temperature characteristics TK becomes extremely large given small ambient temperature steps and would denote a considerable scope of characteristic information.

Let it also be assumed for the exemplary embodiment that every temperature characteristic TK has a characteristic information ki allocated to it. This means that eleven characteristic information ki are provided for eleven temperature characteristics TK of an oscillator crystal Q. Further individual characteristic information ki of an oscillator crystal such as, for example, a shift of the temperature characteristics TK produced by aging of the oscillator crystals Q can also be allocated in addition to these temperature characteristics TK. The temperature in the voltage-controlled oscillator circuit VCOS is measured using the precision oscillator MO in the voltage-controlled oscillator VCOS. To this end, an oscillator crystal QM with which temperature changes cause optimally large resonant frequency deviations is utilized in the precision oscillator MO. This is achieved by specific measuring oscillator crystals having different crystal sections. The measured signals ms formed in the precision oscillator MO are forwarded to the processing means VE, the frequency changes are defined thereat and the temperature change is calculated therefrom. Let it be assumed for the exemplary embodiment that these measured signals ms are inventively modified or influenced dependent on the characteristic information ki of the oscillator crystal Q utilized in the oscillator circuit VCOS. This is achieved in that a divider means DIV is arranged in the oscillator circuit VCOS, the measured signal ms being moved to the input E thereof. The divider means DIV, for example, is realized by a binary counter whose counting rate can be set by supplied characteristic information ki which represent binarily coded information. The divisor of the divider means DIV is determined by the counting rate. With reference to the temperature characteristics TK of FIG. 2, eleven division factors are required in order to allocate eleven temperature characteristics TK to the measured signal ms. The allocation of the temperature characteristics TK, which the oscillator crystal Q utilized in the oscillator circuit VCOS, is achieved by inputting the individual characteristic information ki of the oscillator crystal representing the respective temperature characteristic TK into the memory SP. The memory SP, for example, is realized by a nonvolatile, programmable memory (PROM) or by four switch elements, since with four switch elements $2^3$ coded information can be formed and is sufficient for eleven temperature characteristics TK. According to the input coded binary information ki, the measured signals ms are divided according to the allocated divisor and are communicated via the output AM of the oscillator circuit VCOS to an input EM of the processing means VE. In the processing means VE, the divided measured signals msd are communicated via appropriate connections to first and second evaluation unit AE1, AE2. In the first evaluation unit AE1, the relatively small frequency changes produced by the temperature changes in the oscillator circuit VCOS are recognized or weighted and the result of the weighting is communicated via a local bus LB to a microprocessor means MP. In the second evaluation unit AE2, the divisor effected in the divider DIV means by the characteristic information ki is identified, the binary coded information ki as well as the temperature characteristic TK of the oscillator crystal Q being capable of being derived therefrom. The evaluation of the digital, divided measured signals msd is possible with a second evaluation means AE2 that is realized circuit-oriented and program-oriented. Since the processing means VE usually has a microprocessor MP, the first and second evaluation unit AE1, AE2 is preferably realized with a program in the microprocessor MP.

The characteristic information ki derived in the second evaluation unit AE2 is communicated via the local bus LB to the microprocessor means MP. Using a microprocessor-compatible program, the temperature characteristic information TK1...TK11 stored in a memory SPE connected to the local bus LB and each respectively representing a group of temperature characteristics TK are read out according to the identified characteristic ki and are correspondingly further-processed.

Further, a phase comparison means PE is provided in the processing means VE, the reference clock signal rts and the clock signals ts being communicated to this phase comparison means PE and being phase compared to one another. The phase comparison signals are communicated to a processing program VP in the microprocessor MP, are edited therein in conformity with the phase locked loop and are communicated via an analog-to-digital converter AD to a voltage input VE of the oscillator circuit VCOS.

Alternatively (for example, given the absence of a measuring or: precision oscillator MO), the divider means is to be inserted between the output A of the oscillator circuit VCOS and the oscillator VCO shown with broken lines. It should thereby be noted that the clock signals ts are to be appropriately multiplied in the processing means VE after the identification of the divisor. Furthermore, instead of the divider means DIV, the clock signal ts or measured signal ms can be inserted into means for providing pulse duration or pulse pause modulation. This alternative embodiment in fact slightly increases the outlay of the oscillator circuit VCOS. However, a far-reaching digital processing is possible in the processing means VE, as a result whereof the processing means VE can be predominantly realized in a microprocessor MP.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An oscillator circuit having an oscillator crystal, the oscillator crystal, the oscillator crystal having at least one characteristic information uniquely associated therewith, comprising:

oscillator means for forming oscillation signals from the oscillator crystal, said oscillation signals being digital clock signals and an oscillator means having an output that is a clock signal output, and a means for outputting is for modifying said digital clock signals as a function of said at least one characteristic information;

oscillator output circuit connecting said oscillator means to an oscillator output of the oscillator circuit, said oscillator output circuit conveying said oscillation signals from said oscillator means to said oscillator output;

dedicated means for storing at least one characteristic information of the oscillator crystal;

means for outputting the at least information from the oscillator circuit in the form of one of analog signals, digital signals, coded digital signals and modulated signals, said at least one characteristic information being transferred to an external memory for an external processor to which said means for outputting is coupled;

said oscillator means, said oscillator output circuit, said means for storing and said means for outputinq forming a replaceable electronic circuit element, wherein the external processor uses the at least one characteristic information stored in the external memory for controlling the oscillator circuit;

a clock means for furtherprocessing said digital clock signals, said clock means connected to said clock signal output and having means for recognizing and evaluating the modified digital clock signals such that the at least one characteristic information contained in the modified digital clock signals is derived therefrom.

2. The oscillator circuit according to claim 1, wherein the at least one characteristic information is a temperature characteristic of the oscillator crystal.

3. The oscillator circuit according to claim 2, wherein the at least one characteristic information is a group of temperature characteristics of the oscillator crystal, the group of temperature characteristics being stored in said means for storing characteristic information.

4. The oscillator circuit according to claim 1, wherein said means for modifying said digital clock signals is a modulation means for modulating the digital clock signals with pulse duration modulation.

5. The oscillator circuit according to claim 1, wherein said means for modifying said digital clock signals is a modulation means for modulating the digital clock signals with pulse spacing modulation.

6. The oscillator circuit according to claim 1, wherein said means for modifying said digital clock signals is a frequency-setting means for changing a signal frequency of the digital clock signals in a prescribed manner.

7. The oscillator circuit according to claim 1, wherein said means for modifying said digital clock signals is a level means for varying a signal level of the digital clock signals.

8. The oscillator circuit according to claim 1, wherein said means for modifying said digital clock signals is an impedance means for varying an impedance of the clock signal output of the oscillator circuit.

9. The oscillator circuit according to claim 1, wherein said means for storing at least one characteristic information of the oscillator crystal is an adjustable setting means for forming digital information and a programmable memory means for forming digital information, whereby the digital information is representative of the at least one characteristic information of the oscillator crystal and controls the means for outputting.

10. The oscillator circuit according to claim 1, wherein said means for recognizing and evaluating is a demodulation means for demodulating the digital clock signals with pulse duration modulation.

11. The oscillator circuit according to claim 1 wherein said means for recognizing and evaluating is a demodulation means for demodulating the digital clock signals with pulse spacing modulation.

12. The oscillator circuit according to claim 1, wherein said means for recognizing and evaluating is a frequency-detection means for detecting changes in a signal frequency of the digital clock signals.

13. The oscillator circuit according to claim 1, wherein said means for recognizing and evaluating is a level-measuring means for measuring variations in a signal level of the digital clock signals.

14. The oscillator circuit according to claim 1, wherein said means for recognizing and evaluating is an impedance means for varying an impedance of the clock signal output of the oscillator circuit.

15. An oscillator circuit having an oscillator crystal, the oscillator crystal having at least one characteristic information uniquely associated therewith, comprising:

oscillator means for forming oscillation signals from the oscillator crystal;

oscillator output circuit connecting said oscillator means to an oscillator output of the oscillator circuit, said oscillator output circuit conveying said oscillation signals from said oscillator means to said oscillator output;

dedicated means for storing at least one characteristic information of the oscillator crystal;

means for outputting the at least one characteristic information from the oscillator circuit in the form of one of analog signals, digital signals, coded digital signals and modulated signals, said at least one characteristic information being transferred to an external memory for an external processor to which said means for outputting is coupled, said means for outputting also modifying said oscillation signal as a function of said stored at least one characteristic information;

said oscillator means, said oscillator output circuit, said means for storing and said means for outputting forming a replaceable electronic circuit element, wherein the external processor uses the at least one characteristic information stored in the external memory for controlling the oscillator circuit;

a precision oscillator that provides oscillating measured signals for a temperature measurement of the oscillator circuit;and a measured output circuit connecting said precision oscillator to a measured output of the oscillator circuit, said means for outputting being arranged in said measured output circuit and said means for outputting being connected to said measured output, said means for outputting is being a means for modifying said measured signals as a function of said at least one characteristic information.

16. The oscillator circuit according to claim 15, wherein said means for modifying said measured signals is a modulation means for modulating the measured signals with pulse duration modulation.

17. The oscillator circuit according to claim 15, wherein said means for modifying said measured signals is a modulation means for modulating the measured signals with pulse spacing modulation.

18. The oscillator circuit according to claim 15, wherein said means for modifying said measured signals is a frequency-setting means for changing a signal frequency of the measured signals in a prescribed manner.

19. The oscillator circuit according to claim 15, wherein said means for modifying said measured signals is a level means for varying a signal level of the measured signals.

20. The oscillator circuit according to claim 15, wherein said means for modifying said measured signals is an impedance means for varying an impedance of the measured output of the oscillator circuit.

21. The oscillator circuit according to claim 15, wherein said means for storing at least one characteristic information of the oscillator crystal is an adjustable setting means for forming digital information and a programmable memory means for forming digital information, whereby the digital information is representative of the at least one characteristic information of the oscillator crystal and controls the means for outputting.

22. The oscillator circuit according to claim 15, wherein said oscillator circuit further comprises a clock means for further-processing said measured signals, said clock means connected to said measured output and having means for recognizing and evaluating the modified measured signals such that the at least one characteristic information contained in the modified measured signals is derived therefrom.

23. The oscillator circuit according to claim 22, wherein said means for recognizing and evaluating is a demodulation means for demodulating the measured signals with pulse duration modulation.

24. The oscillator circuit according to claim 22 wherein said means for recognizing and evaluating is a demodulation means for demodulating the measured signals with pulse spacing modulation.

25. The oscillator circuit according to claim 22, wherein said means for recognizing and evaluating is a frequency-detection means for detecting changes in a signal frequency of the measured signals.

26. The oscillator circuit according to claim 22, wherein said means for recognizing and evaluating is a level-measuring means for measuring variations in a signal level of the measured signals.

27. The oscillator circuit according to claim 22, wherein said means for recognizing and evaluating is an impedance means for varying an impedance of the measured output of the oscillator circuit.

* * * * *